(12) United States Patent
Sunaga et al.

(10) Patent No.: US 9,230,882 B2
(45) Date of Patent: Jan. 5, 2016

(54) SIGNAL TRANSMISSION DEVICE

(71) Applicant: Hitachi Metals, Ltd., Minato-ku, Tokyo (JP)

(72) Inventors: Yoshinori Sunaga, Hitachinaka (JP);
Yoshiaki Ishigami, Hitachi (JP);
Hidetaka Kawauchi, Hitachi (JP);
Hidenori Yonezawa, Hitachi (JP);
Kinya Yamazaki, Hitachi (JP)

(73) Assignee: Hitachi Metals, Ltd., Tokyo (JP)

( * ) Notice: Subject to any disclaimer, the term of this patent is extended or adjusted under 35 U.S.C. 154(b) by 253 days.

(21) Appl. No.: 14/046,372

(22) Filed: Oct. 4, 2013

(65) Prior Publication Data

US 2014/0140011 A1 May 22, 2014

(30) Foreign Application Priority Data

Nov. 16, 2012 (JP) .................................. 2012-251781

(51) Int. Cl.
*H01L 23/40* (2006.01)
*H01L 23/433* (2006.01)

(52) U.S. Cl.
CPC ............ *H01L 23/4338* (2013.01); *H01L 23/40* (2013.01); *H01L 23/4006* (2013.01); *H01L 2924/0002* (2013.01)

(58) Field of Classification Search
CPC ... H01L 23/40; H01L 23/4006; H01L 23/433; H01L 23/4338
See application file for complete search history.

(56) References Cited

U.S. PATENT DOCUMENTS

| | | | | |
|---|---|---|---|---|
| 5,430,611 A | * | 7/1995 | Patel et al. | 361/705 |
| 5,500,556 A | * | 3/1996 | Kosugi | 257/718 |
| 6,025,991 A | * | 2/2000 | Saito | 361/704 |
| 6,049,469 A | * | 4/2000 | Hood et al. | 361/818 |
| 6,180,436 B1 | * | 1/2001 | Koors et al. | 438/117 |
| 6,347,950 B1 | * | 2/2002 | Yokoyama et al. | 439/248 |
| 6,365,964 B1 | * | 4/2002 | Koors et al. | 257/718 |
| 6,388,189 B1 | * | 5/2002 | Onoue | 174/383 |
| 6,566,879 B1 | * | 5/2003 | Vanek et al. | 324/318 |
| 6,728,104 B1 | * | 4/2004 | Ahmad et al. | 361/704 |
| 7,780,469 B2 | * | 8/2010 | Zschieschang et al. | 439/485 |
| 2008/0128895 A1 | * | 6/2008 | Oman et al. | 257/712 |
| 2013/0063899 A1 | * | 3/2013 | Kuroda | 361/718 |
| 2013/0088836 A1 | * | 4/2013 | Kuroda | 361/700 |
| 2014/0133101 A1 | * | 5/2014 | Sunaga et al. | 361/699 |
| 2014/0262449 A1 | * | 9/2014 | Gektin et al. | 174/252 |

FOREIGN PATENT DOCUMENTS

| | | | | |
|---|---|---|---|---|
| DE | 4210834 A1 | * | 10/1993 | ............. H01L 23/36 |
| JP | 61061449 A | * | 3/1986 | ............. H01L 23/52 |
| JP | 61074356 A | * | 4/1986 | ............. H01L 23/34 |
| JP | 2010-175995 A | | 8/2010 | |

* cited by examiner

*Primary Examiner* — Robert J Hoffberg
(74) *Attorney, Agent, or Firm* — Crowell & Moring LLP (57) ABSTRACT

Thermal connection between a plurality of communication modules and a heatsink placed on these communication modules is securely achieved and maintained. In a signal transmission device in which a common heatsink is arranged on a plurality of communication modules equipped on a board, the signal transmission device has a coil spring provided between the board and the communication modules, and the communication modules are biased toward the heatsink by the coil spring so that an upper surface of the communication module is pressed against a bottom surface of the heatsink.

8 Claims, 6 Drawing Sheets

SIGNAL TRANSMISSION DEVICE

CROSS-REFERENCE TO RELATED APPLICATION

The present application claims priority from Japanese Patent Application No. 2012-251781 filed on Nov. 16, 2012, the content of which is hereby incorporated by reference into this application.

TECHNICAL FIELD OF THE INVENTION

The present invention relates to a signal transmission device used for signal transmission between boards in an electronic device and for signal transmission between electronic devices.

BACKGROUND OF THE INVENTION

The signal transmission device as described above is provided with: a plurality of communication modules equipped on a board on which a semiconductor chip (IC chip) is mounted; and a cooling mechanism for cooling these communication modules.

A heatsink is cited as an example of the cooling mechanism for the communication modules, and a conventional signal transmission device can be roughly classified as follows based on an aspect of the heatsink. That is, the conventional signal transmission device can be roughly classified into a type in which the heatsinks are provided respectively for the plurality of communication modules (see Japanese Patent Application Laid-Open Publication No. 2010-175995 (Patent Document 1)) and a type in which one heatsink is provided for the plurality of communication modules, and the latter is called "aggregation type" and is distinguished from the former. Accordingly, also in the following explanation, a type of a signal transmission device in which a common heatsink is provided for the plurality of communication modules is called "aggregation type" in some cases.

In the conventional aggregation-type signal transmission device, the heatsink is placed on the plurality of communication modules so as to cover these communication modules. Therefore, it is not required to widen a distance between the communication modules adjacent to each other in order to avoid interference between the heatsinks adjacent to each other, so that there is a merit that the plurality of communication modules can be highly densely arranged in periphery of the IC chip.

SUMMARY OF THE INVENTION

However, when the plurality of communication modules are equipped on the board, heights of all communication modules do not completely match each other. That is, each height from a surface (mounting surface) of the board to an upper surface of each communication module is varied. Such height variation is mainly caused by individual difference (tolerance) of the communication module, and is also caused by various factors such as individual difference of a connector connected to the communication module.

In any case, if the heights of the plurality of communication modules equipped on the board are varied, when the common heatsink is placed on these communication modules, a space is caused between an upper surface of a part of the communication modules and a bottom surface of the heatsink.

Accordingly, the variation in the heights of the communication modules are conventionally absorbed by a heat conduction sheet arranged between the upper surfaces of the communication modules and the bottom surface of the heatsink.

However, for sufficiently absorbing the variation in the heights of the communication modules by the heat conduction sheet, it is required to thicken the heat conduction sheet. More specifically, it is required to use a heat conduction sheet having a thickness equal to or larger than a difference between the lowest communication module and the highest communication module. On the other hand, by increasing the thickness of the heat conduction sheet, heat resistance is increased, and heat conductivity transferred from the communication module to the heatsink is decreased. Accordingly, it is required to enhance a cooling performance of the heatsink in order to maintain an operational temperature of the communication modules within a predetermined range, and therefore, the requirement increases a size of the heatsink, and, as a result, increases a size of the signal transmission device.

A preferred aim of the present invention is to securely achieve and maintain thermal connection between the plurality of communication modules and the heatsink placed on these communication modules.

A signal transmission device of the present invention is a signal transmission device in which a common heatsink is arranged on a plurality of communication modules equipped on a board, the signal transmission device has an elastic member provided between the board and the plurality of communication modules, and the plurality of communication modules are biased toward the heatsink by the elastic member so that upper surfaces of the plurality of communication modules are pressed against a bottom surface of the heatsink.

In an aspect of the present invention, a first connector is provided in the board, a second connector is provided in each of the plurality of communication modules, and each of the plurality of communication modules is reciprocable between the board and the heatsink within a range of an effective length of fit capable of maintaining electrical conduction between the first connector and the second connector.

In another aspect of the present invention, bias force caused by the elastic member is larger than fit holding force between the first connector and the second connector.

In still another aspect of the present invention, the elastic member is a body separately formed from the communication module.

In still another aspect of the present invention, the elastic member is a coil spring.

In still another aspect of the present invention, the elastic member is a body integrally formed with the communication module.

In still another aspect of the present invention, the elastic member is a leaf spring formed of a part of a case of the communication module.

In still another aspect of the present invention, two or more elastic members are provided, the two or more elastic members including: a first elastic member arranged at a position closer to the first connector and the second connector than center of the communication module in a plan view; and a second elastic member arranged at a position farther from the first connector and the second connector than the center of the communication module in the plan view.

In still another aspect of the present invention, bias force caused by the first elastic member is larger than bias force caused by the second elastic member.

According to the present invention, thermal connection between the plurality of communication modules and the heatsink placed on these communication modules is securely achieved and maintained.

DESCRIPTIONS OF THE PREFERRED EMBODIMENTS

Figure 1:
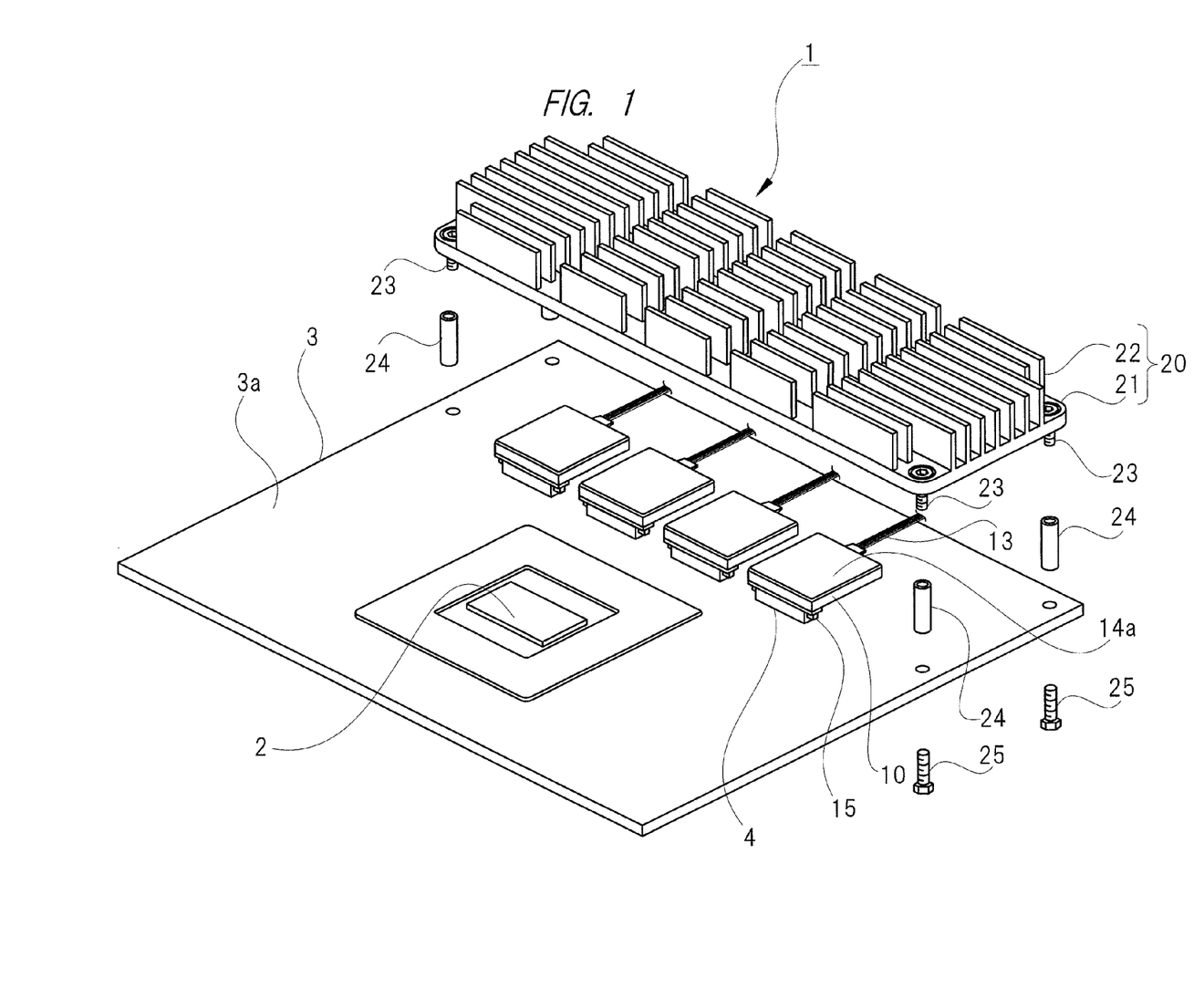
FIG. 1 is an exploded perspective view illustrating an example of a signal transmission device to which the present invention is applied.
Figure 2:
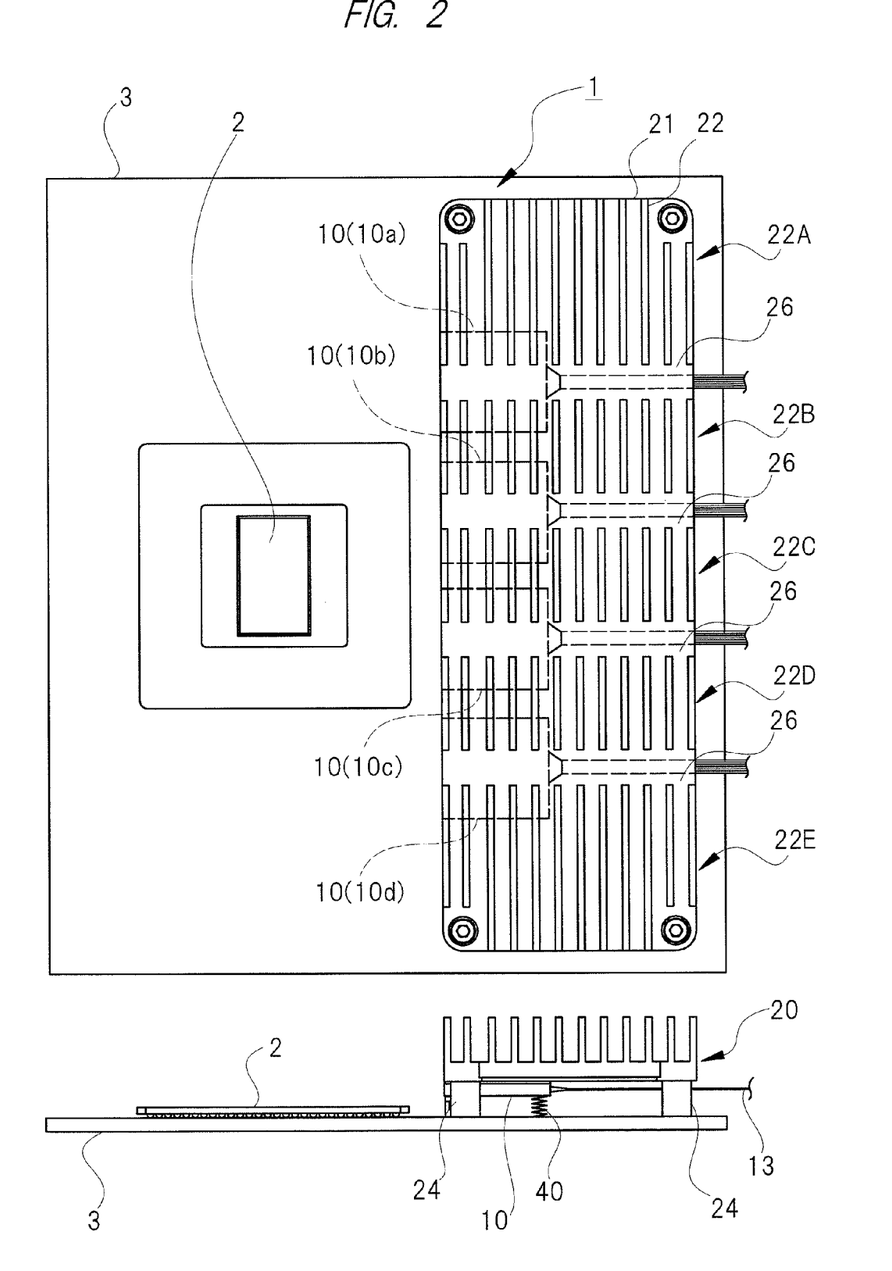
FIG. 2 is a plan view and a side view illustrating the example of the signal transmission device to which the present invention is applied.

Hereinafter, an example of embodiments of the present invention will be described in detail with reference to drawings. A signal transmission device 1 illustrated in FIGS. 1 and 2 is provided with: a plurality of communication modules 10 equipped on a board (motherboard) 3 on which an IC chip 2 is mounted; and a heatsink 20 configuring a cooling mechanism for cooling these communication modules 10. The heatsink 20 is provided with: a heat absorption plate 21 whose plane surface is substantially rectangular; and a plurality of heat release fins 22 provided on the heat absorption plate 21. The heat absorption plate 21 and the heat release fins 22 are integrally formed with each other so as to be made of metal (such as aluminum or copper) having excellent heat conductivity.

In the present embodiment, in vicinity of one side (long side) of the IC chip 2, four communication modules 10 are aligned in line in parallel to the one side. Also, the heatsink 20 is arranged on the plurality of communication modules 10 so as to overlap therewith so that one side (long side) of the heat absorption plate 21 is in parallel to the one side of the IC chip 2. By the corresponding arrangement, an upper surface of each communication module 10 faces a bottom surface of the heatsink 20.

Figure 3:
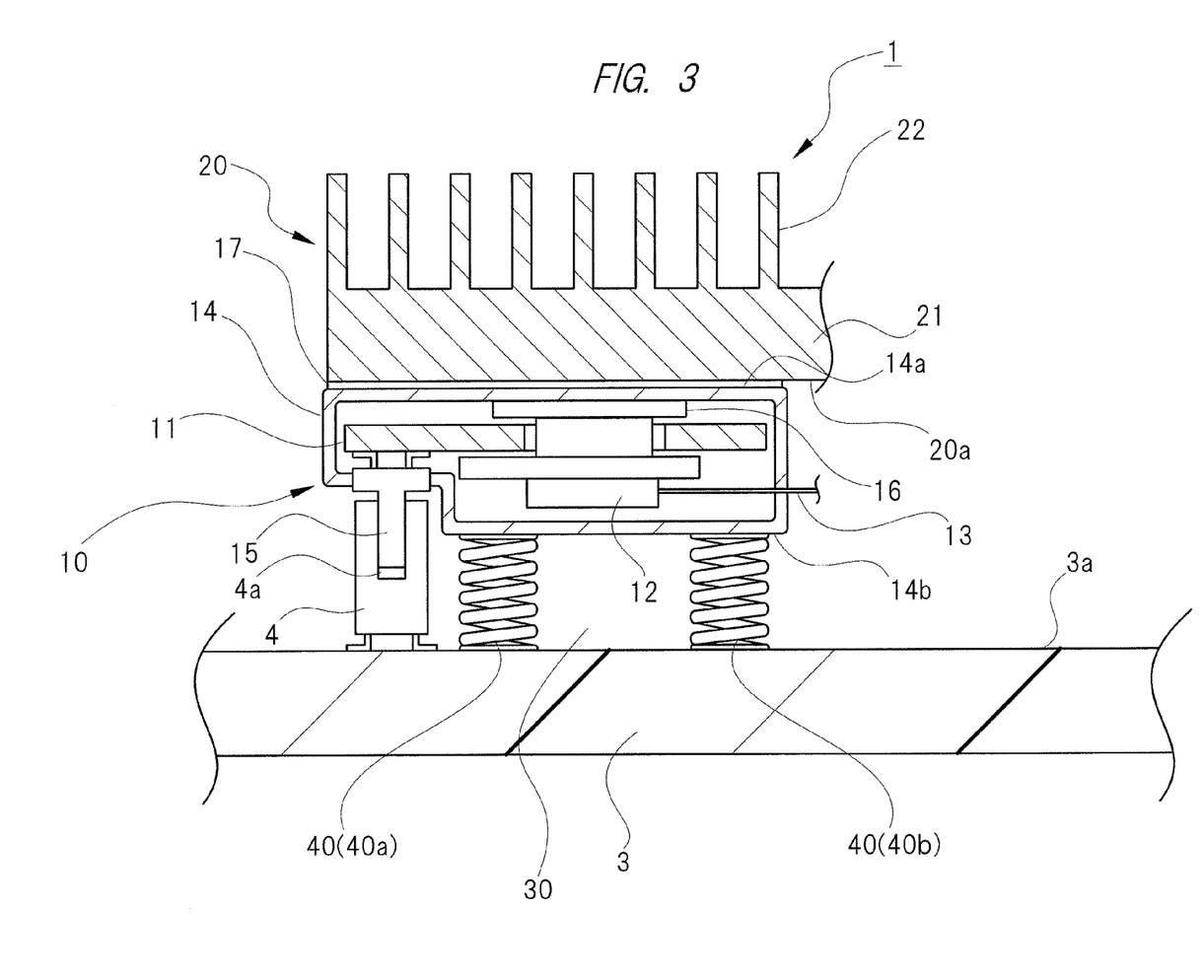
FIG. 3 is a partially-enlarged cross-sectional view of the signal transmission device to which the present invention is applied.

As illustrated in FIG. 3, each communication module 10 is provided with: a module board 11; an optical package 12 equipped on the module board 11; an optical fiber 13 serving as a communication cable extending from the optical package 12; and a module case 14 having a substantially rectangular shape for housing them, and an upper surface 14a of the communication module 10 is formed of a ceiling plate of the module case 14, and a lower surface 14b of the communication module 10 is formed of a bottom plate of the module case 14.

In the lower surface 14b of the communication module 10, a module-side connector 15 serving as a second connector is provided. The module-side connector 15 is linearly formed in vicinity of one side of the lower surface 14b of the communication module 10 along the one side, and has a connection terminal provided on a surface thereof although not illustrated. The connection terminal of the module-side connector 15 is electrically connected to the optical package 12 via a print wiring formed in the module board 11 although not illustrated.

Meanwhile, in a mounting surface 3a of the board 3, a board-side connector 4 serving as a first connector is provided. In the board-side connector 4, an upward-opened groove 4a to/from which the module-side connector 15 can be inserted/removed is formed linearly in a longitudinal direction, and a connection terminal not illustrated is provided in an inner surface of the groove 4a. The connection terminal of the board-side connector 4 is electrically connected to the IC chip 2 (FIG. 1) via a print wiring formed in the board 3 although not illustrated.

The communication module 10 is mounted on the board 3 by inserting (fitting) the module-side connector 15 into the groove 4a of the connector 4 from above the board-side connector 4. Also, when the module-side connector 15 is fitted to the groove 4a of the board-side connector 4, the connection terminals provided in the connectors 15 and 4 are in contact to each other so as to electrically conduct to each other. In this manner, the IC chip 2 and each communication module 10 illustrated in FIG. 1 are electrically connected to each other, so that a signal can be transmitted and received to/from each other. Note that the communication module 10 (optical package 12) converts an electrical signal outputted from the IC chip 2 into an optical signal and inputs the optical signal into the optical fiber 13, and converts an optical signal outputted from the optical fiber 13 into an electrical signal and inputs the electrical signal into the IC chip 2. That is, the communication module 10 converts signals inputted into/outputted from the IC chip 2 in E/O conversion and O/E conversion.

When the mounting structure as described above is applied to the communication module 10, the communication module 10 is supported so as to be a cantilever with respect to the board 3, and a space 30 is caused between the board 3 and the communication module 10 as illustrated in FIG. 3. More specifically, the space 30 is caused between the mounting surface 3a of the board 3 and the lower surface 14b of the communication module 10, and a coil spring 40 serving as the elastic member is arranged so as to be compressed in this space (dead space) 30.

A length of fit and an effective length of fit exist in a relation between the board-side connector 4 and the module-side connector 15 fitted thereto. The effective length of fit is a length contained in the length of fit, and is a length in a range in which the electrical conduction between the board-side connector 4 and the module-side connector 15 is maintained. That is, at the beginning of the insertion of the module-side connector 15 into the board-side connector 4, both connectors 4 and 15 are physically fitted to each other but not electrically conducted to each other. Then, when the module-side connector 15 is further inserted into the board-side connector 4, both connectors 4 and 15 are electrically conducted to each other. Further, the effective length of fit has a certain length (for example, 0.5 to 1.0 mm), and therefore, the electrical conduction between both connectors 4 and 15 is maintained within the range even if the module-side connector 15 is inserted into/removed from the board-side connector 4. In other words, the module-side connector 15 fitted to the board-side connector 4 is movable upward and downward on a sheet of FIG. 3 while maintaining the electrical conduction with the board-side connector 4.

Meanwhile, the bias force of the coil spring 40 is larger than fit holding force between the board-side connector 4 and the module-side connector 15. Here, the fit holding force is mainly force caused by contact resistance between the board-side connector 4 and the module-side connector 15, and is force against force in the removing direction applied to the module-side connector 15 which has been inserted into the board-side connector 4. Thus, as illustrated on a left side of FIG. 4, in a state before the heatsink 20 is equipped on the communication module 10, the module-side connector 15 and the communication module 10 are pushed upward on a sheet of FIG. 4 by the bias of the coil spring 40. When the module-side connector 15 is pushed upward beyond the effective length of fit, the electrical conduction between the module-side connector 15 and the board-side connector 4 is released. Further, when the module-side connector 15 is pushed upward beyond the length of fit, the module-side connector 15 is removed from the board-side connector 4, and even the fitting between both of the connectors 4 and 15 is released. Accordingly, a natural length of the coil spring 40 is set so that the module-side connector 15 is not pushed upward beyond the effective length of fit. Therefore, also in the state illustrated on the left side of FIG. 4, the electrical conduction between the board-side connector 4 and the module-side connector 15 is secured.

Figure 4:
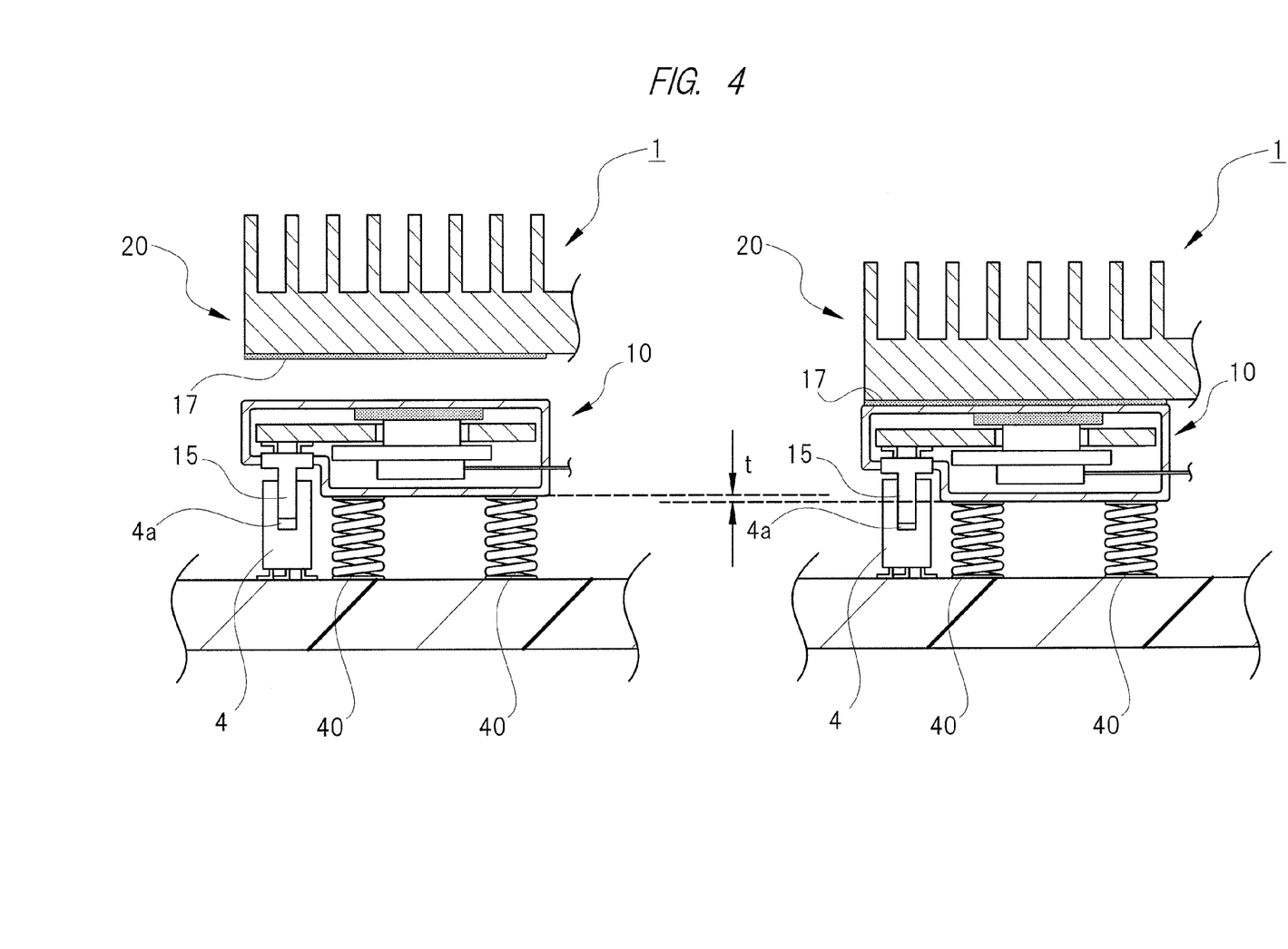
FIG. 4 is a partially-enlarged cross-sectional view illustrating states before and after a heatsink is equipped on a communication module.

On the other hand, as illustrated on a right side of FIG. 4, when the heatsink 20 is equipped on the communication module 10, the communication module 10 is pushed downward on the sheet within the range of the effective length of fit between the connectors 4 and 15, so that the coil spring 40 is compressed so as to be in a state as illustrated in FIG. 3.

Note that the heatsink 20 equipped on the communication module 10 is fixed to the board 3 at four corners thereof by bolts 23 as illustrated in FIG. 1. More specifically, each cylinder-shaped spacer 24 is arranged between the heat absorption plate 21 of the heatsink 20 and the board 3. A female screw is formed in each of an upper end surface and a lower end surface of each spacer 24, a bolt 23 penetrating through the heat absorption plate 21 from up to down is connected to the female screw formed in the upper end surface of the spacer 24, and a bolt 25 penetrating through the board 3 from down to up is connected to the female screw formed in the lower end surface of the spacer 24. Accordingly, a distance from the mounting surface 3a of the board 3 to the bottom surface 20a of the heatsink 20 illustrated in FIG. 3 is defined by a length of the spacer 24 illustrated in FIG. 1. That is, the spacer 24 defines a push-down amount (t) of the communication module 10 illustrated in FIG. 4, and, as a result, plays a role of defining a compression amount of the coil spring 40. And, the spacer 24 also plays a role of preventing the excess push down of the communication module 10 to cause breakage, deformation, and others in the connectors 4 and 15.

Also in the state illustrated in FIG. 3, the effective length of fit still remains in the relation between the board-side connector and the module-side connector 15. Therefore, when the communication module 10 illustrated in FIG. 3 is pushed downward, the communication module is moved toward a direction of being away from the heatsink 20 (=direction of being close to the board 3). Also, the push down is released, it is moved toward a direction of being close to the heatsink 20 (=direction of being away from the board 3) by the bias of the coil spring 40. That is, even if the heatsink 20 is equipped on the communication module 10, the communication module is reciprocable between the heatsink 20 and the board 3 within the range of the effective length of fit between the connectors 4 and 15.

By such a structure as described above, the communication module 10 illustrated in FIG. 3 is biased toward the heatsink 20 by elastic restoring force of the coil spring 40. As a result, the upper surface 14a of the communication module 10 is pressed against the bottom surface 20a of the heatsink 20, and is thermally connected thereto. More specifically, the optical package 12 serving as a main heat source inside the communication module 10 is connected to an inner surface of the ceiling plate of the module case 14 via a heat conduction sheet 16. Also, an outer surface of the ceiling plate of the module case 14 (the upper surface 14a of the communication module 10) is connected to the bottom surface 20a of the heatsink 20 via a heat conduction sheet 17. That is, the upper surface 14a of the communication module 10 is adhered to the bottom surface 20a of the heatsink 20 via the heat conduction sheet 17. Therefore, heat generated from the optical package 12 is transferred to the ceiling plate of the module case 14 via the heat conduction sheet 16. The heat transferred to the ceiling plate of the module case 14 is transferred to the heatsink 20 via the heat conduction sheet 17, and is radiated from surfaces of the heat release fins 22 to air.

As illustrated in FIG. 2, each communication module 10 is arranged so as to be bridged between two heat-release fin groups in a plan view. More specifically, a communication module 10a is bridged between a heat-release fin group 22A and a heat-release fin group 22B. A communication module 10b is bridged between the heat-release fin group 22B and a heat-release fin group 22C. A communication module 10c is bridged between the heat-release fin group 22C and a heat-release fin group 22D. A communication module 10d is bridged between the heat-release fin group 22D and a heat-release fin group 22E. That is, two heat-release fin groups are allocated to one communication module 10.

Further, each space 26 is provided between the heat-release fin groups adjacent to each other. Each space 26 plays a role which generates turbulence flow between the adjacent heat-release fin groups so as to enhance a cooling effect.

As described above, in the signal transmission device 1 according to the present embodiment, each of the plurality of communication modules 10 is biased toward the heatsink 20 by the coil spring 40. Therefore, even if the individual difference exists among the communication modules 10, the upper surface 14a of each communication module 10 is pressed against the bottom surface 20a of the heatsink 20, and is thermally connected thereto. Therefore, it is not required to thicken the heat conduction sheet 17 arranged between the communication module 10 and the heatsink 20 in order to absorb the variation in the heights of the communication modules 10, and it is only required for the heat conduction sheet 17 to have a sufficient thickness required for achieving the original preferred aim. Also, the bias force of the coil spring 40 is always applied to each communication module 10, and therefore, the space is not caused between the upper surface 14a of the communication module 10 and the bottom surface 20a of the heatsink 20 even if the thickness of the heat conduction sheet 17 changes due to aged deterioration or others, so that the thermal connection between both of them is maintained.

Also, the coil spring 40 is arranged in the dead space between the board 3 and the communication module 10. Therefore, it is not required to separately secure a space for arranging the coil spring 40, so that the increase in the size of the signal transmission device 1 and the increase in the height thereof due to the addition of the coil spring 40 are prevented.

Here, in the state illustrated in FIG. 3, when the communication module 10 is moved upward on the sheet, this communication module 10 comes close to the heatsink 20. On the other hand, when the communication module 10 is moved downward on the sheet, this communication module 10 separates away from the heatsink 20. However, if the board 3 is placed in, for example, such a different direction from the state illustrated in FIG. 3 as being turned clockwise by an angle of 90 degrees, when the communication module 10 is moved rightward on the sheet, this communication module 10 comes close to the heatsink 20. On the other hand, when the communication module 10 is moved leftward on the sheet, this communication module 10 separates away from the heatsink 20. In the present invention, it is important that, reasonably enough, the communication module which is reciprocable between the board and the heatsink is biased toward the heatsink, which results in the pressing of the upper surface of the communication module against the bottom surface of the heatsink as a result, and therefore, it is not essential that the moving direction of the communication module is any of the up-and-down direction (vertical direction), the right-and-left direction (horizontal direction), and other directions.

Figure 5:
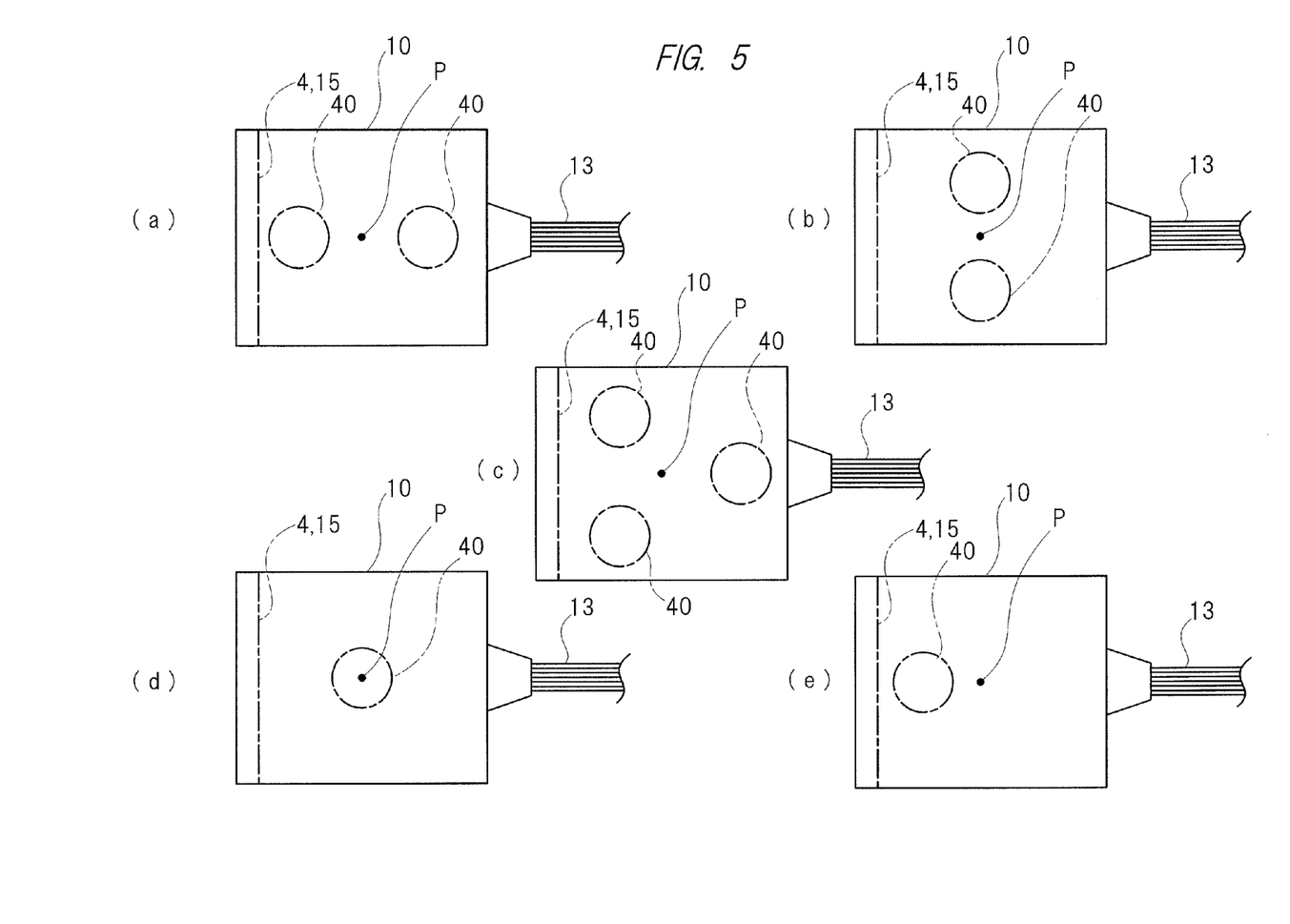
FIG. 5 is schematic views (a) to (e) illustrating different examples of a relative positional relation between the communication module and a coil spring.

The present invention is not limited to the above-described embodiment and various modifications can be made within the scope of the present invention. For example, while two coil springs 40 are provided for one communication module 10 in the above-described embodiment, the number of the coil spring 40 for one communication module 10 may be one, or three or larger. Also, the relative positional relation between the communication module 10 and the coil spring 40 is not limited to the above-described embodiment, either. FIG. 5 schematically illustrates some examples of the relative positional relation between the communication module 10 and the coil spring 40. An example (a) of FIG. 5 illustrates the relative positional relation between the communication module 10 and the coil spring 40 in the above-described embodiment, and examples (b) to (e) of FIG. 5 illustrate modification examples of the relative positional relation between the communication module 10 and the coil spring 40. Reasonably enough, the elastic member is not limited to the coil spring.

Also, when two or more elastic members are provided for one communication module, it is preferred that at least one elastic member is arranged at a position closer to a connector than center of the communication module in a plan view, and that at least the other elastic member is arranged at a position farther from the connector than the center of the communication module in the plan view in a viewpoint of the pressing of the upper surfaces of the communication modules against the bottom surface of the heatsink as even as possible. In the examples illustrated as (a) and (c) of FIG. 5 in this viewpoint, at least one coil spring 40 serving as the elastic member is arranged at a position closer to the connectors 4 and 15 than center "P" of the communication module 10 in a plan view, and at least the other coil spring 40 serving as the elastic member is arranged at a position farther from the connectors 4 and 15 than the center P of the communication module 10.

Further, when two or more elastic members are provided for one communication module, bias forces of these elastic members may be the same as or different from each other. Still further, when two or more elastic members having different bias forces from each other are provided for one communication module, it is preferred that the bias force of the elastic member relatively close to the connector is larger than the bias force of the elastic member relatively away from the connector. For example, the bias forces of the two coil springs 40 illustrated in FIG. 3 are the same as each other. However, if the bias forces of two coil springs are different from each other, it is preferred that the bias force of the coil spring 40a relatively close to the connectors 4 and 15 is larger than the bias force of the coil spring 40b relatively away from the connectors 4 and 15. This is because, if the bias force of the coil spring 40b is larger than the bias force of the coil spring 40a, force which rotates the communication module 10 counterclockwise is applied to the communication module 10. In other words, to the module-side connector 15, force in a direction in which this connector 15 is pushed into the board-side connector 4 is applied. Accordingly, there is a risk that the pressing of the upper surface 14a of the communication module 10 against the bottom surface 20a of the heatsink 20 is uneven. When one elastic member is provided for one communication module, it is preferred from the same reason that the elastic member is arranged at a position closer to a connector than center of the communication module in a plan view. In this viewpoint, in the example illustrated as (e) of FIG. 5, the coil spring 40 serving as the elastic member is arranged at a position closer to the connectors 4 and 15 than the center P of the communication module 10 in the plan view.

In the above-described embodiment, the coil spring 40 serving as the elastic member is the body separately formed from the communication module 10. However, an embodiment in which the communication module and the elastic member are integrally formed with each other is also cited. For example, as illustrated in FIG. 6, an embodiment in which the elastic member is configured of a plate spring 41 formed by bending a part of a bottom plate of the module case 14 is also cited.

The heatsink 20 according to the above-described embodiment is a heatsink of an air cooling type configured of the heat absorption plate 21 and the heat release fins 22. However, the heatsink 20 can be replaced with a heatsink of a liquid cooling type provided with at least the heat absorption plate 21 and a refrigerant passage through which refrigerant for heat exchange to/from the heat absorption plate 21 is circulated.

Figure 6:
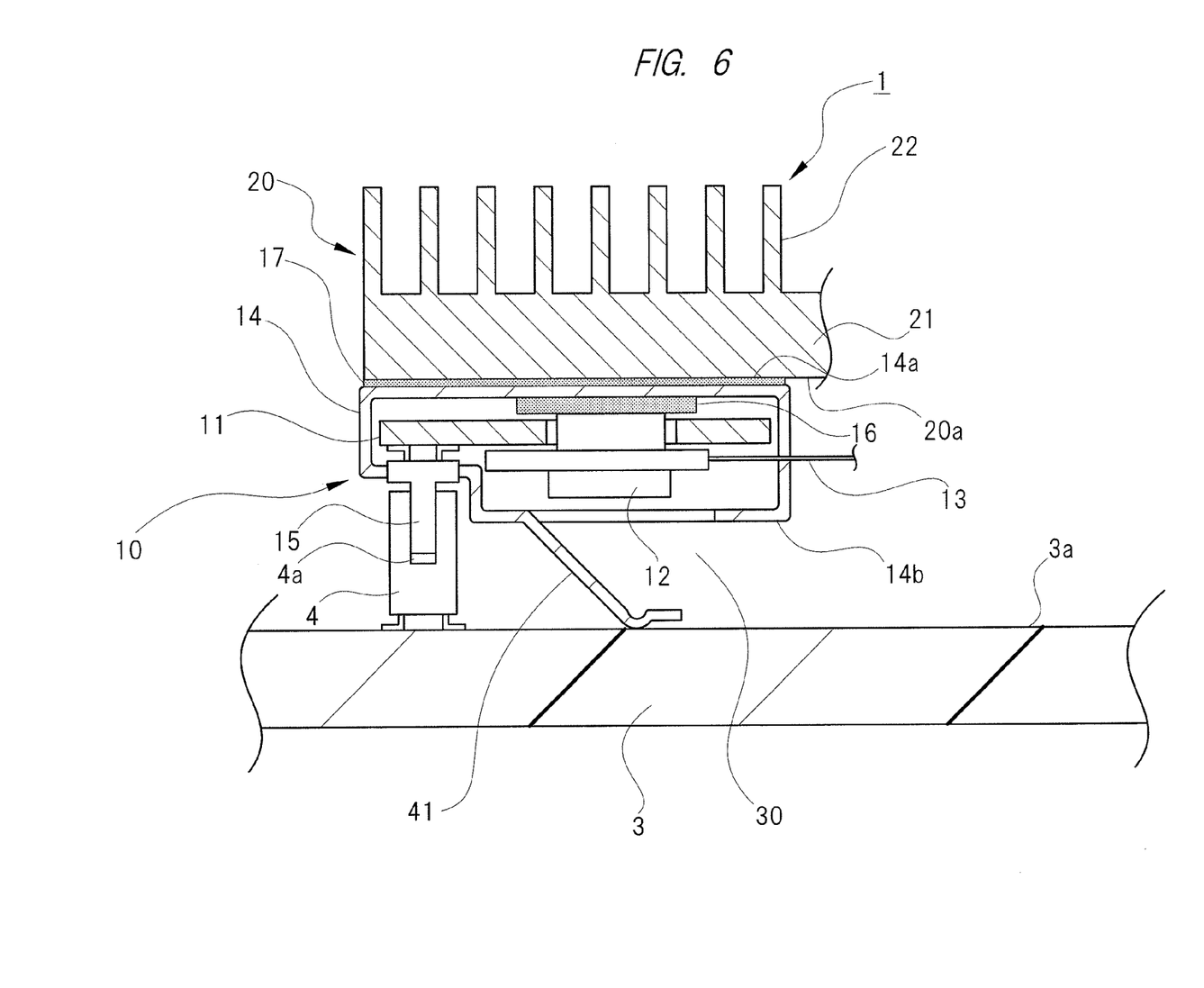
FIG. 6 is a partially-enlarged cross-sectional view illustrating another example of the signal transmission device to which the present invention is applied.

Either or both of the heat conduction sheets 16 and 17 illustrated in FIGS. 3 and 6 can be replaced with grease having excellent heat conductivity or others.

The communication module 10 can be arranged so as to surround four sides of the IC chip 2 illustrated in FIG. 1 or others. Also, the communication module 10 can be arranged along two sides or three sides of the IC chip 2. In any case, in the signal transmission device of the present invention in which the common heatsink is provided for the plurality of communication modules, it is not required to avoid the interference between the adjacent heatsinks, and therefore, the plurality of communication modules can be highly densely arranged in periphery of the IC chip, so that a distance of signal transmission between each communication module and the IC chip can be shortened.

What is claimed is:

1. A signal transmission device having a common heatsink arranged on a plurality of communication modules equipped on a board, the signal transmission device comprising:
an elastic member provided between the board and the plurality of communication modules; and
a plurality of first connectors provided in the board and a second connector provided in each of the plurality of communication modules,
wherein the plurality of communication modules are biased toward the common heatsink by the elastic member so that upper surfaces of the plurality of communication modules are pressed against a bottom surface of the common heatsink, and
wherein each of the plurality of communication module is reciprocable between the board and the common heatsink within a range of an effective length of fit capable of maintaining electrical conduction between a respective one of the first connectors and the second connector.

2. The signal transmission device according to claim 1, wherein bias force caused by the elastic member is larger than fit holding force between the respective one of the first connectors and the second connector.

3. The signal transmission device according to claim 1, wherein the elastic member is a body separately formed from each of the plurality of communication modules.

4. The signal transmission device according to claim 3, wherein the elastic member is a coil spring.

5. The signal transmission device according to according to claim 1, wherein the elastic member is a body integrally formed with each of the plurality of communication modules.

6. The signal transmission device according to claim 5, wherein the elastic member is a leaf spring formed of a part of a case of the communication module.

7. The signal transmission device according to according to claim 1, wherein the elastic member has two or more elastic members including: a first elastic member of the two or more elastic members arranged at a position closer to the first connector and the second connector than a center of each of the communication modules in a plan view; and a second elastic member of the two or more elastic members arranged at a position farther from the respective one of the first connectors and the second connector than the center of each of the communication modules in the plan view.

8. The signal transmission device according to claim 7, wherein a bias force caused by the first elastic member is larger than a bias force caused by the second elastic member.

* * * * *